United States Patent [19]
Kaufman et al.

[11] Patent Number: 6,011,393
[45] Date of Patent: Jan. 4, 2000

[54] SELF-SUPPORTING RF COIL FOR MRI

[75] Inventors: Leon Kaufman, San Francisco; Joseph W. Carlson, Kensington, both of Calif.

[73] Assignee: Toshiba America MRI, Inc., San Francisco, Calif.

[21] Appl. No.: 08/883,083

[22] Filed: Jun. 26, 1997

[51] Int. Cl.[7] .................................................. G01R 33/341
[52] U.S. Cl. .................................................. 324/318
[58] Field of Search ........................... 324/318; 600/422

[56] References Cited

U.S. PATENT DOCUMENTS

| | | | |
|---|---|---|---|
| 4,620,155 | 10/1986 | Edelstein | 324/318 |
| 4,636,729 | 1/1987 | Maurer et al. | 324/318 |
| 4,649,348 | 3/1987 | Flugan | 324/318 |
| 4,692,705 | 9/1987 | Hayes | 324/318 |
| 4,829,252 | 5/1989 | Kaufman | 324/309 |
| 4,831,330 | 5/1989 | Takahashi | 324/318 |
| 5,235,283 | 8/1993 | Lehne et al. | 324/318 |
| 5,334,937 | 8/1994 | Peck et al. | 324/318 |
| 5,357,958 | 10/1994 | Kaufman | 600/410 |
| 5,378,988 | 1/1995 | Pulyer | 324/318 |
| 5,381,122 | 1/1995 | Laskaris et al. | 335/216 |
| 5,435,302 | 7/1995 | Lenkinski et al. | 600/422 |
| 5,474,069 | 12/1995 | Wong et al. | 600/422 |
| 5,519,321 | 5/1996 | Hagen et al. | 324/318 |

FOREIGN PATENT DOCUMENTS

| | | |
|---|---|---|
| 0154360 A1 | 9/1985 | European Pat. Off. . |
| 2304900 | 3/1997 | United Kingdom . |

OTHER PUBLICATIONS

"High Strength and High–Conductivity Cu–Ag Alloys Conductors", Showa Electric Wire & Cable Co. Ltd., advertising brochure, circa 1995.

*Primary Examiner*—Christine Oda
*Assistant Examiner*—Tiffany A. Fetzner
*Attorney, Agent, or Firm*—Nixon & Vanderhye P.C.

[57] ABSTRACT

An RF coil for an MRI system is self-supported by the formed conductor used to make the coil itself. A high-strength, high-conductive, stiff, internally self-supporting Cu-ag alloy may be used.

27 Claims, 7 Drawing Sheets

SELF-SUPPORTING RF COIL FOR MRI

BACKGROUND OF THE INVENTION

1. Field of the Invention

This invention relates to a radio frequency coil for use in a magnetic resonance imaging system. Such radio frequency coils typically operate at a frequency (or band of frequencies) within a range of between 3 and 64 MHz to couple radio frequency energy to and/or from body tissue or other objects located within an imaging volume of a magnetic resonance imaging system.

2. Related Art

The art of magnetic resonance imaging (MRI) is now well developed and several different types of MRI systems are commercially available. In all of them, some means is provided to produce a very strong static magnetic field $H_0$ and controlled spatial magnetic gradients therein (e.g., along three mutually-orthogonal coordinate axes). The static magnetic field is typically of an approximately-homogenous nature within a predefined imaging volume and the controlled magnetic gradients are typically approximately linear with respect to spatial displacements therewithin.

A programmed sequence of radio frequency pulses is transmitted into body portions located within the imaging volume at predetermined frequencies or frequency distributions (typically all situated within the range of 3–64 MHz depending on the strength of $H_0$) so as to selectively nutate the magnetic moment of certain nuclei by predetermined amounts in accordance with well-known nuclear magnetic resonance (NMR) principles. After cessation of such transmitted RF pulses, the NMR nutated atoms tend to relax back toward alignment with the static magnetic field $H_0$ and, in the process, produce characteristic NMR RF signals. Such RF signals are received, detected and processed to thereafter produce a desired MRI image of the body portion located within the imaging area in accordance with any one of many known MRI techniques as will be appreciated by those in the art. The transmitted RF pulses typically are synchronized with a special sequence of current pulses passed through various magnetic gradient coils during the imaging process so as to effect spatial information encoding processes and/or to provide known types of NMR phasing control.

In some MRI apparatus, the static magnetic field $H_0$ and/or the magnetic gradient coils are realized in the form of large solenoidal coils or, in the case of gradient coils, saddle-shaped coils conformed to a generally tubular configuration. In such cases, it is naturally necessary for patient access to the imaging volume to be provided only along a narrow tunnel through the tubular-shaped apparatus. With some patients, this may give rise to claustrophobic reactions. It also makes it extremely cumbersome to access the image volume (e.g., so as to adjust the relative positioning of RF transmit and/or receive coils or to attend to patient needs).

Other types of MRI systems utilize a pair of magnetic poles (e.g., permanent magnets or electromagnets with ferromagnetic poles and flux return paths) disposed on opposite sides of the image volume to create the requisite static magnetic field $H_0$. Necessary magnetic circuits for return flux (i.e., outside the image volume) between the magnetic poles and/or the magnetic gradient coils (e.g., in a tubular form or flat) or decorative cover systems have been constructed in various ways. Early permanent magnet systems limited access to the image volume except along a generally tunnel-shaped area through which the patient was transported into the image volume. Thus, as with the solenoidal field generating devices, access to the image volume initially was essentially limited to only one or two aligned open and unobstructed patient access ports or areas—i.e., the opposite ends of the patient transport tunnel aligned with the patient transport axis.

The present applicant earlier discovered an improved magnetic resonance imaging apparatus wherein the static field magnet and gradient coil and decorative/functional outer cover structures are configured so as to leave an open and unobstructed patient access area communicating directly with the image volume along a direction perpendicular to the patient transport axis (e.g., see U.S. Pat. No. 4,829,252 issued May 9, 1989, the entire contents of which is hereby incorporated by reference). In the preferred exemplary '252 patent embodiment, such transverse access to the imaging volume may be had from two opposite sides of the patient transport mechanism while in yet another exemplary embodiment, such transverse access to the imaging volume passes through one side (or even the top) of the MRI system. In such exemplary embodiments, magnetic flux return circuits are preferably in the form of one or more cylindrical columns (e.g., four of them) disposed radially outwardly of the magnetic poles. In this manner, transverse unobstructed access to the imaging volume is provided not only along the patient transport axis, but also through at least one additional transverse port provided between such columnar return flux circuit structures. The new '252 patented system took unique advantage of an available open static magnet structure by coordinating gradient coil and housing structures so as to maintain such "openness" in the final completed MRI structure. That is, no obstructing housings or other structures were used to obstruct such transverse access path.

No matter how the strong magnetic field $H_0$ is generated, such prior MRI systems have traditionally used essentially pure soft copper conductors for the RF coil structures. Such pure copper conductors are relatively "soft" in that they can be easily altered in shape if not otherwise supported to the desired shape for any given RF coil structure. For example, since the RF coil structures typically come into contact with or close proximity to the human body parts being imaged, it would be unrealistic to expect such soft copper conductors to retain their shape throughout an intended life cycle of repeated usage in practical commercial applications unless given an external supportive structure of some kind (e.g., an exterior supportive skeleton analogous that of exoskeletal members of the animal kingdom).

If RF coils were to be made of soft pure copper without any exterior support, the windings would be expected to move about in space (e.g., when coming into contact with normally expected forces during normal use). This would cause at least two different problems. First, the inductance of the RF antenna coil would change causing a variation in the coupling of a receiver preamp to the coil and therefore a change in the voltage seen by the preamp. Second, the change in coil size changes the emf induced in the rotating magnetic spins (or, by reciprocity the RF field made if the coil is being used as a transmitter). This effect also causes a variation in the received signal. If one were to have variation in signal from one MRI signal acquisition to the next, there would be an unacceptable bleeding of the imaged object in the phase-encoded direction.

Accordingly, it has heretofore been common practice to completely encase the RF coil conductors in an external, supporting, insulative body. For many MRI system environments, such relatively encumbered coil structures are less than optimum. For example, the solid insulating support for the coil conductor may serve to obstruct desired medical procedure access through the coil structure during set up, imaging or between imaging sequences of the MRI system. Furthermore, such a completely closed and solid appearance of the composite coil structure may also adversely enhance claustrophobic feelings or reactions of patients whose body parts may be encompassed by the thus relatively-closed coil structure.

Very stiff, potentially self-supporting electrical conductors are, of course, already known for other applications in the general field of electrical system design. For example, high-strength and high-conductivity copper-silver (Cu-Ag) alloys have been available for some time from Showa Electric Wire and Cable Company, Ltd. (Tokyo Toranomon Bldg., 1-1-18 Toranomon, Minato-ku, Tokyo, 105, Japan or Showa Electric America, Inc., Suite 1142, Russ Bldg., 235 Montgomery Street, San Francisco, Calif., 94104-3062). Such high-strength, high-conductive Cu-Ag alloys have approximately 80% the conductivity of pure copper—but with remarkably higher strength and stiffness. Other stiff (i.e., "hard") conductive materials which may be suitable include Beryllium-copper, phosphor-bronze and titanium. Even if the conductivity of some such stiff materials is less than Cu-Ag, they may still be in a useful range of conductivity. Furthermore, the conductivity may be increased by processing to avoid too much oxygen contamination. Other materials having relatively good conductivity high strength and without ferromagnetic content may also be presently available or may become available in the future.

Such high-conductive/high-strength conductors have been used previously for development of high-field magnets, such as pulse magnets. Such alloys apparently exhibit the combination of high strength and high conductivity due, at least in part, to proper combinations of cold working and heat treatments—but result in alloys that are easily melted and cast or forcefully bent into desired magnet coil structures for high-field magnets. Various standard sizes (e.g., bar lengths having cross-sections of 2×3 mm, 2.5×4 mm, 4×6 mm, etc.) are commercially available and are known to have excellent and uniform characteristics for use in high-field magnet applications.

Attempts apparently have been made previously to find other, more general purpose, applications and markets for this high-strength, high-conductivity Cu-Ag alloy conductive material. Either heat fusion or adhesive-type insulation can be supplied on the conductive bars as supplied by the vendor.

Although RF coils for MRI systems are often schematically depicted in drawings without external support so that one can visualize the individual internal conductors, in commercial practice, the actual RF coil structure utilized with the MRI system is necessarily substantially, if not completely, encased within an exterior supporting insulating body for reasons already noted above. Applicant's search of prior issued U.S. patents has discovered no prior attempt to actually achieve a self-supporting RF coil for an MRI system. For example, the following patents have been reviewed:

| | | |
|---|---|---|
| 4,636,729 | Maurer et al | (1987) |
| 5,435,302 | Lenkinski et al | (1995) |
| 4,620,155 | Edelstein | (1986) |
| 4,649,348 | Flugan | (1987) |
| 4,692,705 | Hayes | (1987) |
| 5,235,283 | Lehne et al | (1993) |
| 5,334,937 | Peck et al | (1994) |
| 5,357,958 | Kaufman | (1994) |
| 5,378,988 | Pulyer | (1995) |

-continued

| | | |
|---|---|---|
| 5,381,122 | Laskaris et al | (1995) |
| 5,474,069 | Wong et al | (1995) |
| 5,519,321 | Hagen et al | (1996) |

Maurer et al direct their teaching to a "self-supporting" magnetic gradient coil system. However, while some of the gradient coil sub-structures appear to be truly "self-supporting" in the sense of (presumably insulated) conductors being directly cemented to one another, the entire gradient coil assemblage is only made "self-supporting" by the use of several longitudinal support elements of non-magnetic insulating material. The primary purpose of the open-type gradient coil structure is apparently an attempt to reduce audible noise within the MRI system during operation. In any event, there is nothing in this reference that would suggest the desirability of making RF coils in any way wholly or even partially "self-supporting".

Lenkinski et al (1995) is actually directed to a flexible RF surface coil—but contrasts such flexible structure against prior art structures said to be "rigid"—citing as examples Edelstein, Flugan and Hayes. However, the RF coil structures therein described are only "rigid" or "stiff", if at all, because they are formed on and attached to the outer surface of a rigid or stiff coil former (or encased in a rigid or stiff casement or the like). None of these references teach or suggest use of a rigid or self-supporting RF coil conductor.

Kaufman, Pulyer and Hagen et al are examples of MRI systems and/or components designed so as to retain some degree of patient access during the imaging process. Peck et al is an example of typical rigid coil former constructions used in MRI systems (this one with gradient coils). Collectively, these plus Lehne et al, Laskaris et al and Wong merely confirm that prior art MRI RF coils are invariably formed from conventional (soft) copper—and most typically made rigid or stiff only by associating the soft copper conductors with rigid external coil former structures.

There may be many reasons that those in the prior art have so far failed to teach or suggest the use of self-supporting stiff conductors for RF coils in an MRI system. For example, the Cu-Ag alloy conductors available from Showa are so very stiff that they are very difficult to bend by hand. Furthermore, since the conductivity of such material is necessarily less than pure copper, use of such material would be contrary to normal inclination for this reason as well. The possible presence of ferromagnetic impurities (e.g., iron, cobalt, nickel, etc.) in alloy conductors may be another reason that those in the prior art have not previously attempted use of such materials in an RF MRI coil application.

SUMMARY OF THE INVENTION

We have now discovered that Cu-Ag alloy conductor of high strength and relatively-high conductivity (e.g., approximately 80% of high purity oxygen-free copper) can be used to provide self-supporting strength and stiffness in the RF coil structure for an MRI system (e.g., analogous to the internal supportive skeletons of vertebrate members of the animal kingdom)—instead of depending upon the strength and stiffness of an external insulating support structure (i.e., an exoskeletal structure) encompassing substantially all of the RF coil conductor. Other relatively stiff conductive materials may also be suitable as noted above. That is, instead of using conventional soft copper (wire, bar, rod, etc.) to make the RF coils for an MRI system, the present invention uses extremely sturdy and stiff (e.g., substantially rigid) conductors for the RF coil in an MRI system. A conductor is stiff and hard enough for use in this invention if it is sufficiently rigid so as not to permit an appreciable amount of variation in a self-supported RF coil antenna inductance or sensitivity in normally expected MRI system usage.

Young's modulus is important with respect to infinitesimal deformations. Tensile strength is useful for defining the force needed to rip the material apart. However, what is more important for defining the stiffness of conductors suitable for use with this invention is the point at which the material starts to undergo a plastic deformation. There are various ways to specify this; the typical methods talk about the proportional limits or the 0.2% yield strength. The latter is a measurement of the point at which the stress-stain curve deviates from linear by 0.2%. For drawn copper, typical numbers are 280 MPa (mega Pascals) for ASTM B124 or ASTM B133 copper. Annealed copper is significantly lower. The Cu-Ag alloy conductor used in our presently preferred embodiment has a 0.2% yield strength of 900 MPa to 980 MPa These numbers are just below ultimate strength.

Other alloys, like cold rolled beryllium copper (ASTM B197) have a 0.2% value of 720 MPa and aluminum bronze (ASTM B169, alloy A) is 450 MPa; these may also be possible conductors for use with this invention.

A threshold value of at least 400 MPa is presently believed to be an approximate minimum value for conductors useful with this invention. This is still well above normal copper grades.

One may also improve the rf conductivity of the loops in other ways. For example, if the wire is plated with a high purity copper, silver or gold for a few skin depths, then one can have the combination of high conductivity on the outside and strength on the inside. One could even use a graded alloy with variable composition along its radius. If a low conductivity metal is used, like titanium, and the outside is plated one could mask part of the wire from the plating. A capacitor placed across the break in the plating would appear to the RF current as a capacitor if the capacitive impedance is sufficiently lower than the resistive impedance of the wire. This allows one to solder capacitors onto the RF coil (bridging gaps in the plating) without sacrificing the strength of the underlying material.

The exemplary embodiment uses the Cu-Ag alloy conductors available from Showa Electric Wire and Cable Company, Ltd. Although the Showa Cu-Ag alloys have only approximately 80% as much conductivity as conventional pure soft copper material, we have discovered that by using approximately 20% additional conductor cross section (and possibly some distributed capacitances along the coil conductor), one can make very acceptable RF coils for an MRI system. Such coils are entirely self-supporting, the conductor itself being insulated with only a very thin layer of insulating material adhered about the exterior of each conductive turn itself.

The use of internally self-supporting (e.g., substantially rigid—albeit perhaps retaining a degree of springiness sufficient to permit opening of a joint to facilitate placement around a body part) MRI RF coil structures contrasts with prior art practices of using relatively soft pure copper material which is externally supported in the desired MRI RF coil shape. That is, to maintain the design coil shape, conventional MRI RF coils must be supported by an external coil former (e.g., Plexiglass™ or some other insulating dielectric material that has sufficient strength and rigidity). Such rigid coil formers necessarily take up space and/or present additional access obstructions and thereby make it more difficult to accommodate patient anatomy within the coil structure and/or to permit medical interventional procedures on the patient anatomy while it is located inside the RF coil structure.

RF coils in an MRI system operate at radio frequencies that are related to the Lamor frequency of NMR nuclei—which is, in turn, related to the strength of magnetic field present at the site of the NMR nuclei. Typical commercial MRI systems operate at low end frequencies of approximately 3 MHz or so (for the lowest commercially-available magnetic field strengths), and at the higher end frequencies of as much as 64 MHz (for the higher field strength MRI systems).

Each MRI system may have as many as a dozen or so RF coils, each being specially designed for use at different times in imaging a certain part of the patient's anatomy. Each coil may use approximately 1 to 7 meters of linear length conductor and may use conductors having different cross-sectional dimensions. For example, rectangular or square cross sections on the order of 3 to 6 mm on each side (e.g., conventionally-available cross sections) may be used. However, for some applications, a thinner rectangular ribbon-shaped conductor having cross-sectional dimensions of about 2–5 cm wide and about 0.5 to 0.25 mm thick may be more suitable.

We have discovered that the Cu-Ag alloy conductors available from Showa Electric Wire and Cable Company have sufficiently-small contamination of potentially ferromagnetic elements (e.g., iron, cobalt, nickel, etc.) that they can be successfully used for RF coils in the MRI environment (provided that about 20% more conductive material is used so as to compensate for the fact that conductivity is only about 80% of that expected for high-purity, oxygen-free copper).

This invention provides a radio frequency coil for a magnetic resonance imaging system formed from a high-strength, high-conductivity, stiff, self-supporting conductor. A Cu-Ag alloy conductor is used in the preferred exemplary embodiment of a multi-turn resonant radio frequency coil adapted to couple radio frequency signals (e.g., in the range of 3–64 MHz) to and/or from a body (e.g., an inanimate body of material, human body tissue, animal body tissue, living or dead, etc.) located within an imaging volume of a magnetic resonance imaging system. In the preferred exemplary embodiment, a thin, non-supporting, insulation layer is closely bonded to the exterior of each turn of the conductor—without encompassing all of the turns of the coil in a common insulating support structure.

The interior conductive stiff support member may also be plated with a more conductive material (e.g., pure copper, gold, etc.) to improve the RF conductivity of the resulting coil structure. To decrease inductance, discontinuities in the plating can be bridged by RF by-pass capacitors.

The conductive coils of this invention typically have a central aperture between about 10 cm and about 65 cm in maximum diameter. The aperture may be circular, oval or arch-shaped. The coil itself is self-supporting, albeit it may be affixed to a base stand for stable positioning with respect to the MRI image volume and/or imaged object. For example, the base stand may include two parts clampable together with a portion of the conductor turns being clamped therebetween at predetermined spacings and positions within grooves formed in at least one of the two parts of the base stand. An insulating separator-spacer may also be disposed between juxtaposed pairs of coil turns so as to maintain a desired fixed spacing therebetween at critical points.

The insulation material applied about the individual linear conductor may be a thin, polystyrene coating (e.g., such as adheres to the conductor by dipping the finished coil structure into a polystyrene solution), a wrapping a Kevlar™ tape, or the installation of a flexible insulating sleeve installed over the formed conductor of the coil.

BRIEF DESCRIPTION OF THE DRAWINGS

These, as well as other objects and advantages of this invention will be more completely understood and appreciated by careful study of the following detailed description of presently preferred exemplary embodiments of this invention taken in conjunction with the accompanying drawings, of which.

DETAILED DESCRIPTION OF EXEMPLARY EMBODIMENTS

Figures 1, 1A:
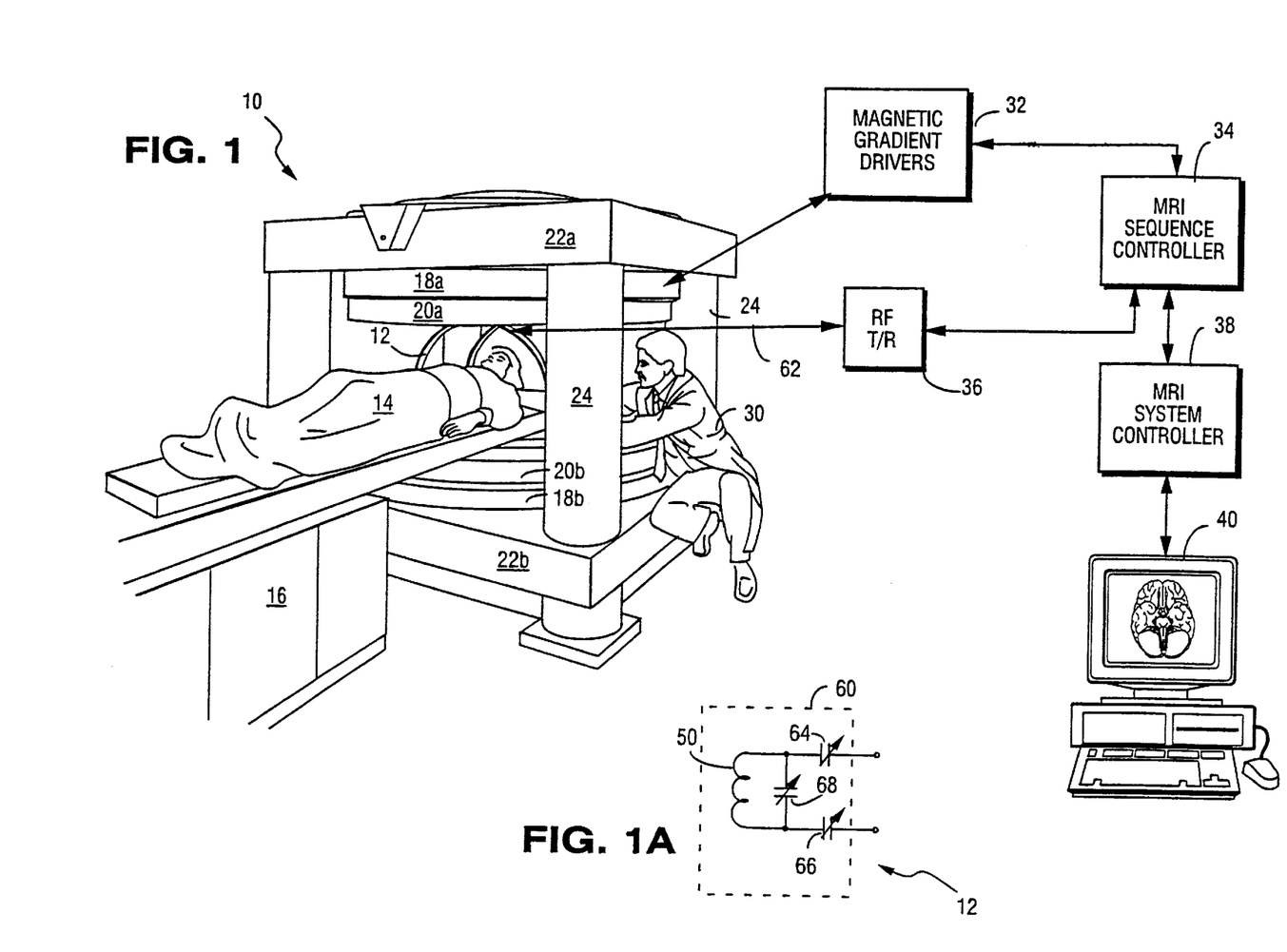
FIG. 1 is a schematic depiction of an MRI system employing a self-supporting RF coil in accordance with this invention.
FIG. 1A is a schematic depiction of an equivalent electrical circuit embodied by a completed RF coil in accordance with this invention.

FIG. 1 depicts a typical, commercially-available open access MRI system 10 incorporating an exemplary radio frequency coil 12 in accordance with this invention. The body coil 12 has an arch-shaped aperture in which a desired portion of the patient 14 is inserted via conventional patient transport mechanism 16. As will be appreciated by those in the art, the radio frequency coil 12 is designed and situated so as to apply properly-oriented radio frequency magnetic fields throughout the image volume of the MRI system 10 located between the magnetic pole pieces 18a, 18b and suitable magnetic gradient coils 20a, 20b. Return magnetic flux between pole pieces 18a, 18b passes via magnetic circuit members 22a, 22b at the top and bottom of the structure respectively and the four supporting columns 24 about the periphery of the main magnet structure. As those in the art will appreciate, superconducting electromagnets may also be used to provide (wholly or partially) the main NMR polarizing magnetic field and other main magnet geometries (e.g., a solenoidal electromagnet) may also be used.

However, in the open access type of MRI system depicted at FIG. 1, a doctor or other attending personnel 30 may have lateral access to the imaging volume while the patient is present. Such access may be useful for interventional procedures either during actual imaging or between imaging sequences (or to set up an imaging sequence). In addition, the open access architecture greatly minimizes claustrophobic effects for the patient. The open architecture also permits relatively-larger body sizes to be easily accommodated and provides other advantages already appreciated by those in the art.

The associated computer-controlled MRI system is extremely complex—but by now well known to those in the field. A greatly simplified depiction of such system is given in FIG. 1. Here, magnetic gradient drivers 32 independently control magnetic gradient coils 20a, 20b (e.g., typically effective in mutually orthogonal X, Y, Z directions) at particular times and amplitudes specified by an MRI sequence controller 34. Similarly, radio frequency transmitter and receiver circuits 36 are controlled to transmit at particular times and power levels (frequencies and phase) and to receive at certain frequency bands at certain times by the same MRI sequence controller 34. Overall MRI system control is typically achieved by a separate computer controller 38 via an operator control console 40 which may include the usual keyboard and display screen for depicting final MRI images (which image data may also be stored in digital format for viewing elsewhere by doctors and staff).

Figure 2A:
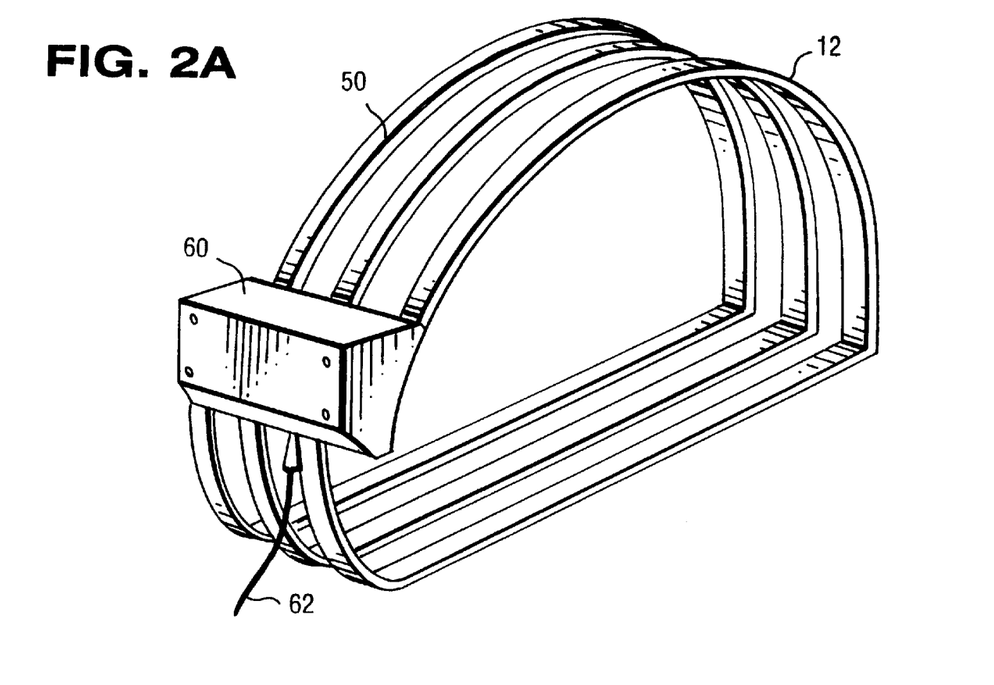
FIGS. 2A–2G schematically depict various typical self-supporting RF coil structures formed from a high-strength, high-conductivity conductor in accordance with this invention.

In the exemplary embodiment of FIG. 1, the radio frequency coil 12 is an internally self-supporting solid, coil made from a high-strength, high-conductivity Cu-Ag alloy conductor formed into a radio frequency resonant coil that is adapted to couple radio frequency signals to and/or from a body located within the imaging volume of the magnetic resonance imaging system. Because the coil conductor is internally self supporting, additional access is permitted between conductor turns. The exemplary body coil 12 is depicted in more detail at FIG. 2A where the individual conductor turns 50 are visible. Terminating connections as well as tuning/impedance matching capacitances are contained within housing 60 which is connected via a coaxial cable 62 to the radio frequency transmit/receive circuits 36.

As schematically depicted in FIG. 1A, the radio frequency coil 12 includes the formed conductive coil turns 50 as well as impedance matching and frequency tuning capacitances 64, 66, 68 in housing 60. The coil design per se may be conventional. That is, the desired size, shape, number of turns, etc., of any particular RF coil structure may be of conventional design —so long as account is taken of the slightly lower conductivity for the high-strength, high-conductivity Cu-Ag alloy conductor. That is, approximately 20% additional conductive material may be needed to provide sufficiently low resistance conductive turns in the coil as compared with the use of conventional, soft, high-purity oxygen-free copper (assuming that a more conductive plating is not used).

Figure 2B:
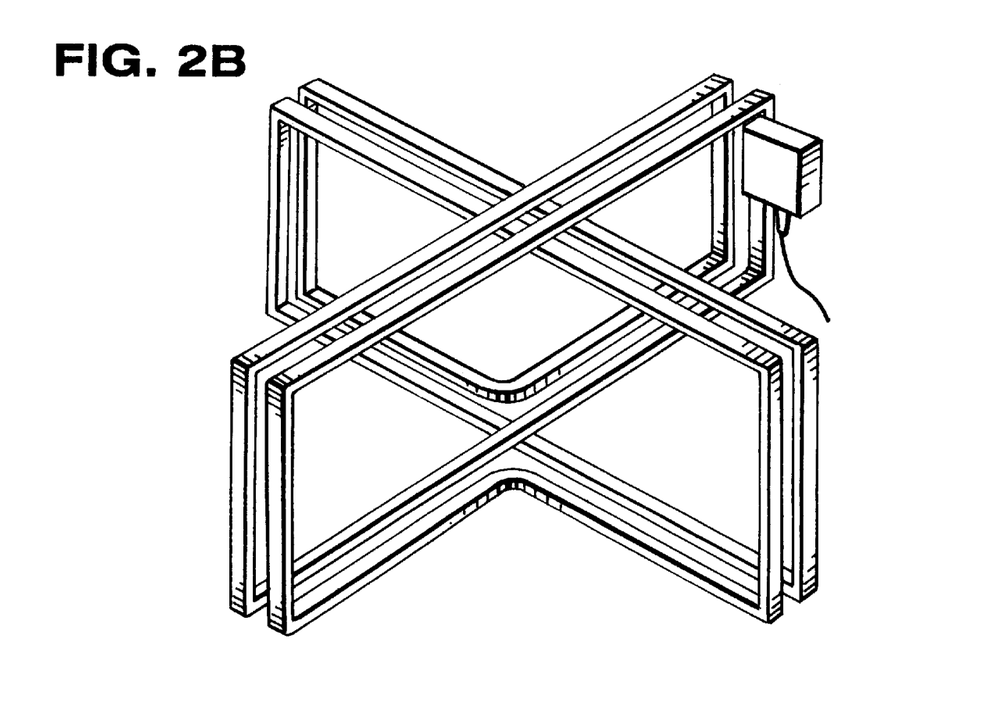
Figure 2C:
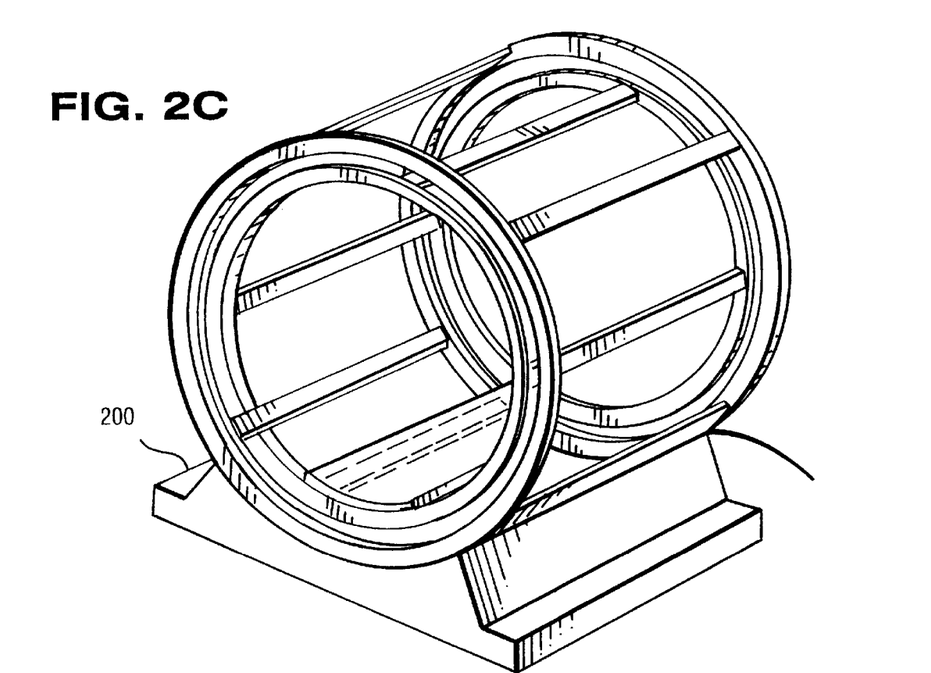
Figure 2D:
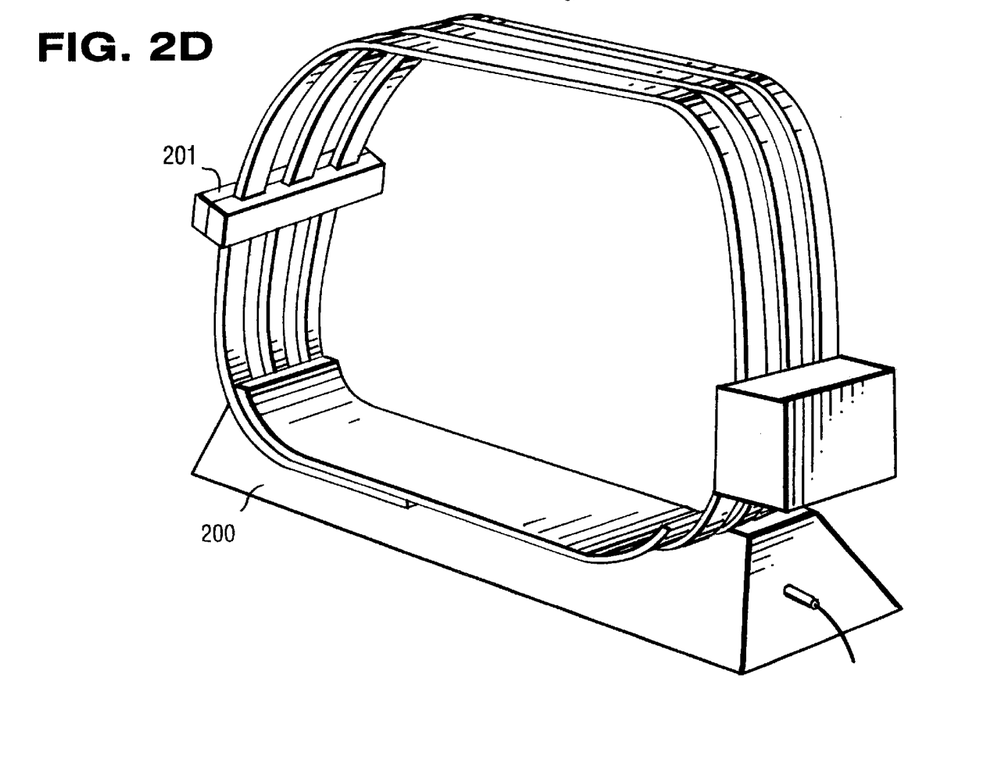
Figure 2E:
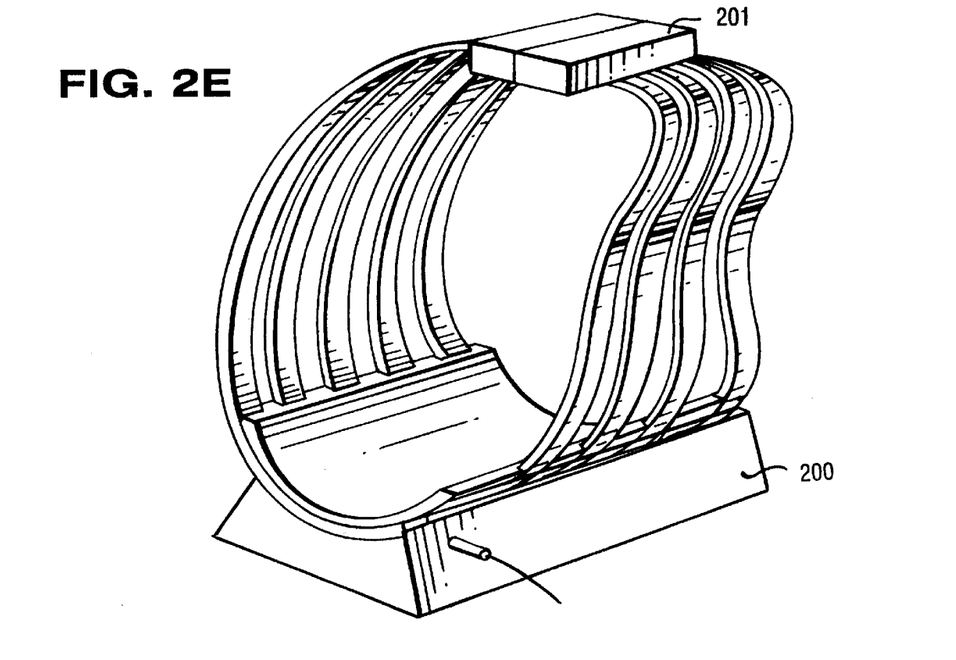
Figure 2F:
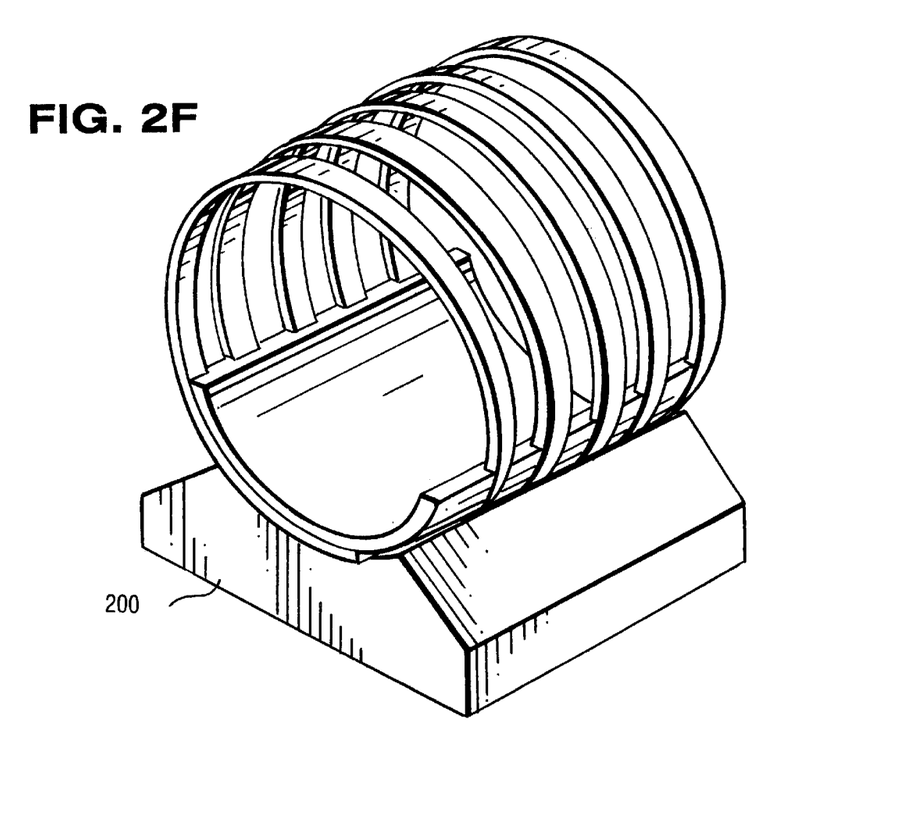
Figure 2G:
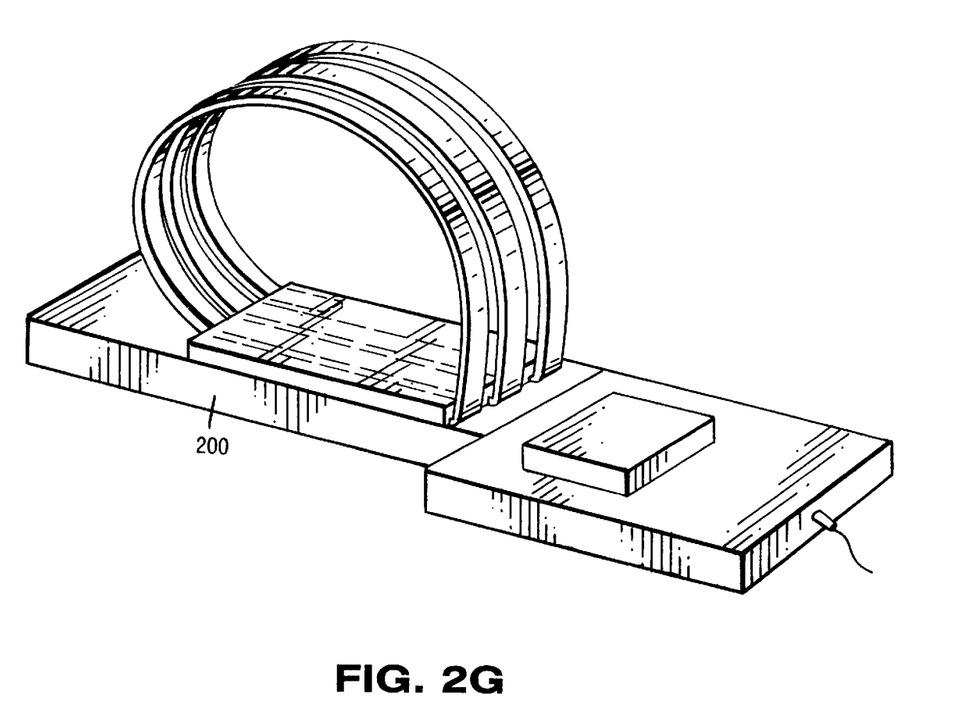

As those in the art will appreciate, there are numerous known RF coil configurations for various applications within an MRI system. Some typical conventional coil designs are depicted at FIGS. 2A–2G. For example, sometimes a separate radio frequency transmit coil is utilized as depicted at FIG. 2B. For other applications, the same RF coil may be used for both transmit and receive functions. A quadrature-detector head coil is depicted at FIG. 2C, an abdomen belt coil with an openable joint coupling 201 (to permit spring the coil structure apart temporarily thus facilitating placement around a human body) is depicted at FIG. 2D, a neck coil at FIG. 2E (also having an openable joint connector coupling 201), a knee coil at FIG. 2F and a shoulder coil at FIG. 2G.

As those in the art will appreciate, there are many other RF coil configurations. However, prior RF coils for MRI have been made of relatively-soft, pure copper so that the coil-shaped-supporting strength of the finished RF coil component is achieved by encapsulating the soft copper conductor within a relatively-rigid insulating exterior body. By contrast, in accordance with this invention, the coil structures of FIGS. 2A–2G are made with high-strength, high-conductivity, interiorly self-supporting conductor stock so that the relatively massive and strong shaped external supporting insulating structure is no longer needed.

While the Cu-Ag alloy conductor in the preferred exemplary embodiment is extremely stiff and strong, it may still be bent so as to conform with a desired shape (e.g., by bending it around a forming jig) without heating. Conductive connections with other high-strength, high-conductivity Cu-Ag alloy conductor segments and/or with terminating connectors, capacitors, etc., may be achieved using conventional soldering or welding techniques and the like.

Young's modulus is important with respect to infinitesimal deformations. Tensile strength is useful for defining the force needed to rip the material apart. However, what is more important for defining the stiffness of conductor suitable for use with this invention is the point at which the material starts to undergo a plastic deformation. There are various ways to specify this; the typical methods talk about the proportional limits or the 0.2% yield strength. The latter is a measurement of the point at which the stress-strain curve deviates from linear by 0.2%. For drawn copper, typical numbers are 280 MPa (mega Pascals) for ASTM B124 or ASTM B133 copper. Annealed copper is significantly lower. The Cu-Ag alloy conductor used in our presently preferred embodiment has a 0.2% yield strength of 900 MPa to 980 MPa These numbers are just below ultimate strength.

Other alloys, like cold rolled beryllium copper (ASTM B197) have a 0.2% value of 720 MPa and aluminum bronze (ASTM B169, alloy A) is 450 MPa; these may also be possible conductors for use with this invention.

A threshold value of at least 400 MPa is presently believed to be an appropriate minimum value for conductors useful with this invention. This is still well above normal copper grades.

Figure 3A:
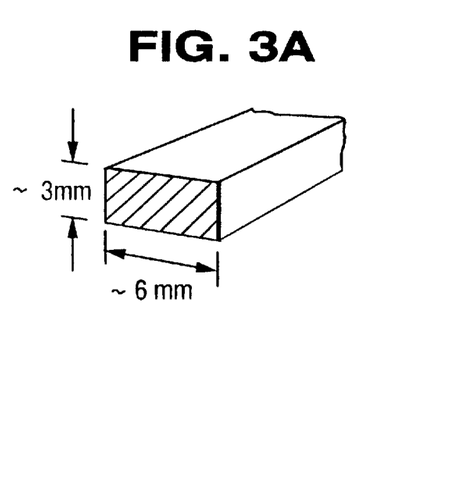
FIGS. 3A–3B depict typical cross-sectional dimensions of the high-strength, high-conductivity conductors utilized in the exemplary embodiments of this invention.
Figure 3B:
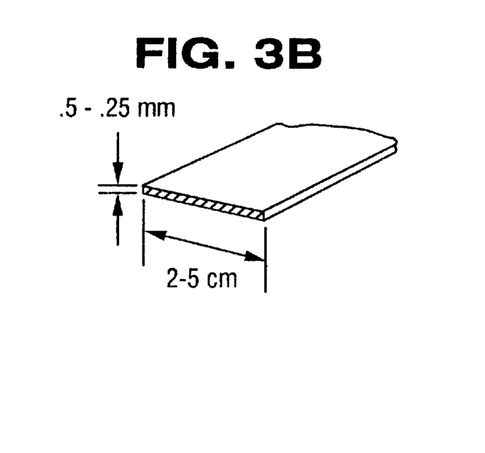
Figure 5A:
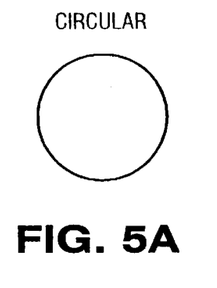
FIGS. 5A–5C depict circular, oval and arch-shaped apertures for typical RF coil structures in accordance with this invention.
Figure 5B:
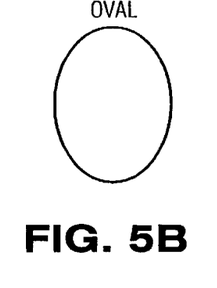
Figure 5C:
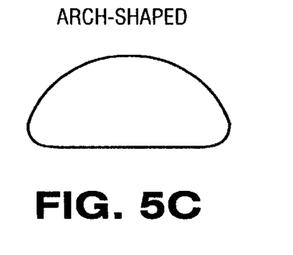

A wide range of square or rectangular cross sections may be utilized for the conductor as depicted at FIGS. 3A and 3B. The RF coil aperture may be circular, oval or arch shaped as depicted in FIGS. 5A, 5B and 5C, respectively—or other desired shapes as will be appreciated by those in the art.

Figure 6A:
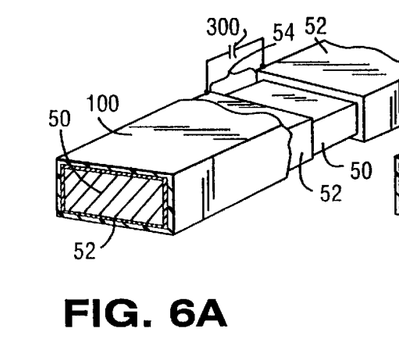
FIGS. 6A–6C depict various exemplary thin, non-supporting plated coatings and/or insulating coatings for the high-strength, high-conductivity conductors used in the exemplary embodiments of this invention.
Figure 6B:
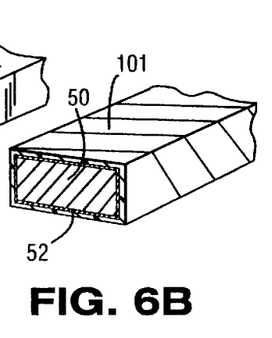
Figure 6C:
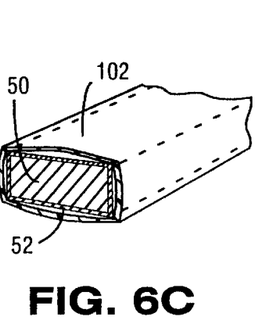

Suitable insulation can be individually applied to each conductor member. For example, a coating 100 may be applied as depicted in FIG. 6A by dipping the finished coil structure in a polystyrene solution. Alternatively, the conductive members may be wrapped with material 101 such as a Kevlar™ tape as depicted in FIG. 6D. The insulating members may also be insulated by installing an insulating sleeve 102 over the conductor as depicted in FIG. 6C. In any event, the insulator is no longer the primary strength member used for maintaining the desired design shape of the RF coil structure.

Suitable higher conductivity plating 52 can also be applied over the stiff internally supportive conductor 50. The thickness of the plated coating 52 should be several skin depths at the expected operating RF frequencies. In addition, discontinuities 54 can be formed in the plating 52 (e.g., exposing conductor 50) and RF-bridged by suitable by-pass capacitors 300 (e.g., to reduce the overall inductance of the coil that must otherwise be tuned and matched to the feed RF frequency and transmission line).

The apertures can be of widely-ranging sizes from approximately 10 cm in maximum diameter to approximately 65 cm in maximum diameter.

Figure 7:
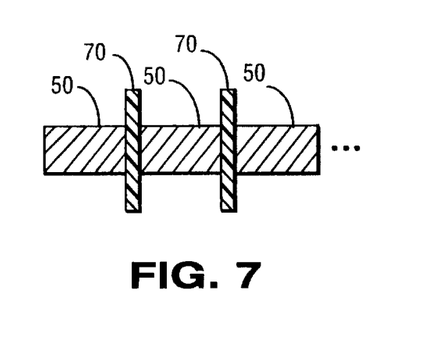
FIG. 7 depicts the use of solid spacers between conductive turns of an RF coil so as to maintain desired spacing between coil turns at critical parts of the coil structure.

At particular points in the coil structure, desired spacing between the turns 50 may also be maintained by discrete insulating spacers 70 as depicted in FIG. 7.

Figure 4:
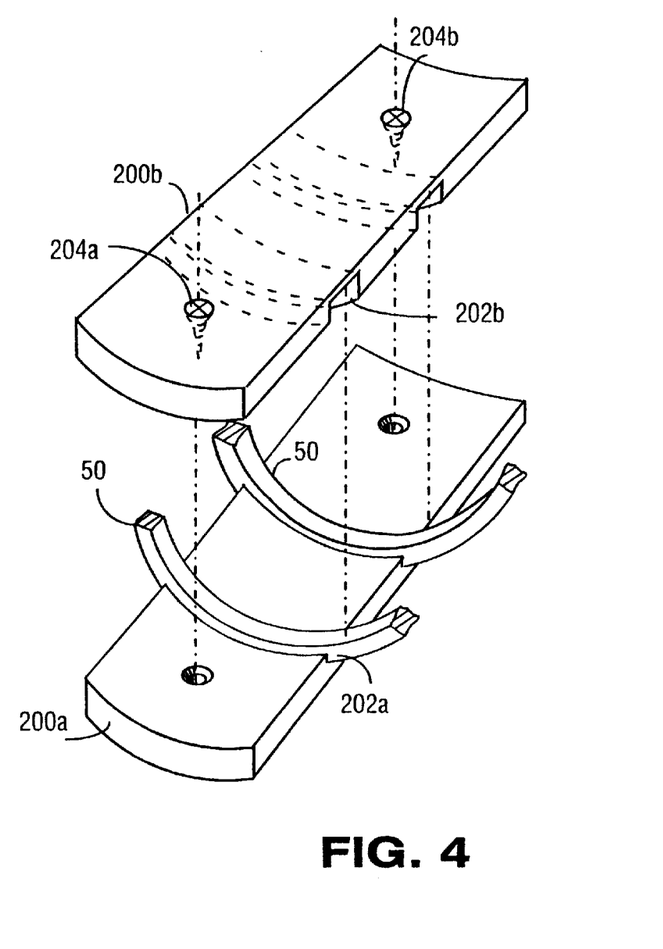
FIG. 4 is a partial exploded view of a base stand for use with exemplary embodiments of the RF coils made in accordance with this invention.

In some embodiments a base stand 200 may be utilized to help stabilize the coil structure in a desired position and orientation during use. For example, see the base stands 200 associated with exemplary coil structures in FIGS. 2C–2G. The base 200 may be used to hold a plurality of conductive loops in a clamping arrangement. For instance, the base unit may be formed of two pieces 200a and 200b as depicted in FIG. 4. Grooves 202a and/or 202b may be cut in at least one surface of the base members. The loops 50 then can be placed in such grooves and the matching pieces screw connected together (e.g., via screws 204a and 204b) to hold the top piece of the base 200b clamped against the lower part of the base 200a with the loops 50 being captured within the grooves 202a, 202b and clamped thereat so as to maintain inter-loop spacing.

Figure 8:
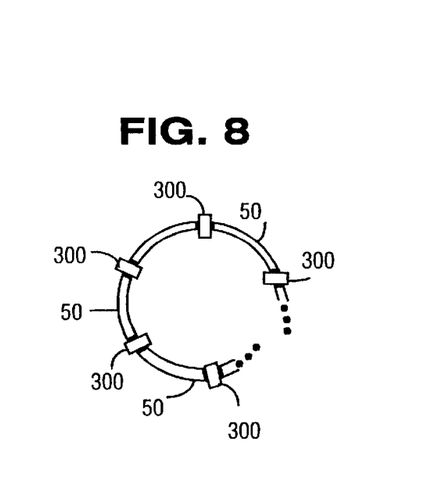
FIG. 8 depicts distributed capacitors serially inserted along the RF coil conductor of this invention.

Experiments with a two-turn, head-sized RF loop have shown that a relatively-large inductance (e.g., about 2.4μ for these two loops) can be expected with the somewhat more bulky, less-conductive material (e.g., the high-strength, high-conductivity Cu-Ag alloy conductor of the exemplary embodiment). At radio frequencies typical of medium field strength MRI systems (e.g., 15 MHz), it can be difficult to make an inductor of such large inductance resonate with a high Q. In particular, tuning/matching capacitors may have to be very small and the coil structure itself with inherent self-capacitance may even be close to self-resonant at some frequencies. Accordingly, as depicted in FIG. 8, the conductor (and/or an included outer more conductive plating 52) may be interrupted with small button RF by-pass capacitors or the like so as to effectively place distributed capacitance between turn segments (perhaps between each two turn segment of a multi-turn RF coil).

The amount of capacitance thus distributed throughout the coil structure acts to reduce the overall effective inductive reactance of the coiled RF coil conductor and thus move its self-resonances to higher frequencies and makes it easier to tune at the desired RF frequency. While such interposed capacitances can be quite strongly and rigidly interconnected between conductive segments of the main stiff supporting structure, the introduction of such distributed capacitances in that manner nevertheless would inherently make the coil structure less physically robust than if the coil is formed as a single continuous length of coil conductor "spring". Accordingly, in such embodiments, a clamping base stand 200 may become a very important component of the overall coil assembly. Further, if an external more conductive plating is employed, then the capacitors may bridge mere incontinuities in the plating so as to leave the underlying internal skeleton structure fully intact.

While this invention has been described with respect to only a few specifically described exemplary embodiments, those skilled in the art will recognize that many variations and modifications may be made in these exemplary embodiments while yet retaining significant novel advantages and features of this invention. Accordingly, all such variations and modifications are intended to be included within the scope of the appended claims.

What is claimed is:

1. A radio frequency coil for a magnetic resonance imaging system, said radio frequency coil comprising:

a high-strength, relatively-stiff, internally self-supporting conductor formed into a radio frequency resonant coil that is adapted to couple radio frequency signals to and/or from a body located within an imaging volume of a magnetic resonance imaging system, and wherein said conductor has a 0.2% yield strength greater than 400 MPa.

2. A radio frequency coil as in claim 1 wherein said conductor includes a Cu-Ag alloy formed into at least one loop having an aperture between about 10 cm and about 65 cm.

3. A radio frequency coil as in claim 1 wherein said conductor includes a plated coating of conductive material.

4. A radio frequency coil as in claim 3 wherein there is at least one discontinuity in said coating which discontinuity is bridged by a capacitor connected thereacross.

5. A radio frequency coil as in claim 2 wherein said aperture is a circular aperture.

6. A radio frequency coil as in claim 2 wherein said aperture is an oval aperture.

7. A radio frequency coil as in claim 2 wherein said aperture is an arch-shaped aperture.

8. A radio frequency coil as in claim 1 wherein:

said coil conductor is insulated by relatively-thin, non-supporting insulation material.

9. A radio frequency coil as in claim 8 wherein said insulation material comprises a polystyrene coating.

10. A radio frequency coil as in claim 9 wherein said insulation material comprises a man-made fibrous wrapping.

11. A radio frequency coil as in claim 8 wherein said insulation material comprises a flexible insulating sleeve installed over the formed conductor.

12. A radio frequency coil as in claim 1 comprising a plurality of conductor turns attached to a base stand.

13. A radio frequency coil as in claim 12 wherein said base stand comprises at least two parts clamped together with a portion of the conductor turns being clamped therebetween at predetermined spacings and positions by grooves formed in at least one of said two parts.

14. A radio frequency coil as in claim 12 comprising an insulating separator disposed between juxtaposed turns to maintain fixed spacing therebetween.

15. A radio frequency coil as in claim 1 wherein said conductor has a square or rectangular cross section of about 3–6 mm on each side.

16. A radio frequency coil as in claim 1 wherein said conductor has a rectangular ribbon cross-sectional shape of about 2 to 5 cm wide and about 0.5 to 0.25 mm thick.

17. A radio frequency coil for a magnetic resonance imaging system, said radio frequency coil comprising:

a high-strength, high-conductivity, stiff, internally self-supporting conductor having a 0.2% yield strength greater than 400 MPa, and the conductor being formed into a multi-turn resonant radio-frequency coil that is adapted to couple radio-frequency signals in a predetermined band of frequencies within the range of 3–64 MHz to and/or from a body located within an imaging volume of a magnetic resonance imaging system, and a thin, non-supporting insulation layer bonded to the exterior of each turn of said conductor without collectively encompassing all of said turns in a common insulating support structure.

18. A radio frequency coil as in claim 17 wherein said conductor includes a plated coating of conductive material.

19. A radio frequency coil as in claim 18 wherein said conductive coating includes at least one discontinuity bridged by a capacitor connected thereacross.

20. A radio frequency coil as in claim 17 wherein said insulation layer comprises a polystyrene coating on the conductor.

21. A radio frequency coil as in claim 17 wherein said insulation layer comprises a man-made fibrous wrapping.

22. A radio frequency coil as in claim 17 wherein said insulation layer comprises a flexible insulating sleeve installed over the formed conductor.

23. A radio frequency coil as in claim 17 comprising a plurality of conductor turns attached to a base stand.

24. A radio frequency coil as in claim 23 wherein said base stand comprises at least two parts clamped together with a portion of the conductor turns being clamped therebetween at predetermined spacings and positions by grooves formed in at least one of said two parts.

25. A radio frequency coil as in claim 23 comprising an insulating separator disposed between juxtaposed turns to maintain fixed spacing therebetween.

26. A radio frequency coil as in claim 17 wherein said conductor has a square or rectangular cross section of about 3–6 mm on each side.

27. A radio frequency coil as in claim 17 wherein said conductor has a rectangular ribbon, cross-sectional shape of about 2 to 5 cm wide and about 0.5 to 0.25 mm thick.

* * * * *